United States Patent
Tamatsuka et al.

(10) Patent No.: US 6,478,883 B1
(45) Date of Patent: Nov. 12, 2002

(54) SILICON SINGLE CRYSTAL WAFER, EPITAXIAL SILICON WAFER, AND METHODS FOR PRODUCING THEM

(75) Inventors: Masaro Tamatsuka, Annaka (JP); Ken Aihara, Annaka (JP); Katsuhiko Miki, Annaka (JP); Hiroshi Takeno, Annaka (JP); Yoshinori Hayamizu, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/529,661

(22) PCT Filed: Aug. 27, 1999

(86) PCT No.: PCT/JP99/04652
§ 371 (c)(1),
(2), (4) Date: Apr. 18, 2000

(87) PCT Pub. No.: WO00/12787
PCT Pub. Date: Mar. 9, 2000

(30) Foreign Application Priority Data

Aug. 31, 1998 (JP) .......................... 10-260843
Aug. 31, 1998 (JP) .......................... 10-260844
Aug. 31, 1998 (JP) .......................... 10-260846

(51) Int. Cl.$^7$ .................. H01L 29/30; C30B 21/06; C30B 27/02; C30B 28/10; C30B 30/04
(52) U.S. Cl. .................. 148/33.2; 117/20; 117/21; 438/497; 438/500
(58) Field of Search ............... 438/471–477, 438/497–499, 503–506; 117/2, 13, 20, 21; 148/33.2

(56) References Cited

U.S. PATENT DOCUMENTS 5,066,359 A * 11/1991 Chiou .................... 156/651
5,935,320 A * 8/1999 Graef et al. .................. 117/2
6,222,252 B1 * 4/2001 Numano et al. ............ 257/617

FOREIGN PATENT DOCUMENTS

JP    A-9-298135    11/1997
JP    A-10-303208   11/1998

OTHER PUBLICATIONS

Pagini, et al. "Spatial variations in oxygen precipitation in silicon after high temperature rapid thermal annealing" in Applied Physics Letters 70(12), Mar. 24, 1997, pp. 1572–1574.*
Zhou, et al. "TEM study of nitrogen enhanced oxygen precipitation in nitrogen-doped Czochralski-grown silicon" in the conference proceedings of the Institute of Physics, Conference Series v 117, IOP Publishing Ltd: Bristol, England, (1991), pp. 211–216.*
T. Abe et al., *Dynamic Behavior Of Intrinsic Point Defects In FZ And CZ Silicon Crystals*, Mat. Res. Soc. Symp. Proc., vol. 262, pp. 3–13, 1992.

* cited by examiner

Primary Examiner—Olik Chaudhuri
Assistant Examiner—Erik Kielin
(74) Attorney, Agent, or Firm—Oliff & Berridge, PLC

(57) ABSTRACT

A silicon wafer for epitaxial growth consisting of a highly boron-doped silicon single crystal wafer, an antimony-doped silicon single crystal wafer or a phosphorus-doped silicon single crystal wafer, which allows easy oxygen precipitation and exhibits high gettering ability in spite of its suppressed oxygen concentration, and an epitaxial silicon wafer in which an epitaxial layer grown by using the aforementioned wafer as a substrate wafer has an extremely low heavy metal impurity concentration are produced with high productivity and supplied. The present invention relates to a boron-doped silicon single crystal wafer having a resistivity of from 10 mΩ·cm to 100 mΩ·cm, an antimony-doped silicon single crystal wafer, or a phosphorus-doped silicon single crystal wafer, which are produced by slicing a silicon single crystal ingot grown by the Czochralski method with nitrogen doping. The present invention also relates to an epitaxial wafer, wherein an epitaxial layer is formed on a surface of the aforementioned wafers. The present invention further relates to method for producing them.

21 Claims, 4 Drawing Sheets

SILICON SINGLE CRYSTAL WAFER, EPITAXIAL SILICON WAFER, AND METHODS FOR PRODUCING THEM

TECHNICAL FIELD

The present invention relates to an epitaxial silicon single crystal wafer for the manufacture of semiconductor devices with reduced heavy metal impurities present in an epitaxial layer, which impurities degrade reliability of the devices, and a boron-doped silicon single crystal wafer, antimony-doped silicon single crystal wafer, and phosphorus-doped silicon single crystal wafer, which serve as a substrate of the epitaxial wafer, as well as methods for producing them.

BACKGROUND ART

Epitaxial silicon single crystal wafers have long been widely used as wafers for the manufacture of discrete semiconductors, bipolar ICs and so forth because of their excellent characteristics. Moreover, as also for MOS LSIs, they are widely used for microprocessor units or flash memory devices because of their excellent soft error and latch up characteristics. Furthermore, in order to improve poor reliability of DRAMs caused by the so-called grown-in defects, which are introduced at the time of the production of silicon single crystals, the need of epitaxial silicon single crystal wafers has been increasingly enlarged.

However, existence of heavy metal impurities on epitaxial silicon single crystal wafers used for such semiconductor devices yields poor characteristics of the semiconductor devices. In particular, as a degree of cleanness required for the latest devices, it is considered that heavy metal impurity concentration must be $1 \times 10^{10}$ atoms/cm$^2$ or less, and therefore heavy metal impurities existing on silicon wafers must be reduced as much as possible.

Moreover, in recent researches, it has been pointed out that, even in such epitaxial wafers, influence of the grown-in defects present at surfaces of substrate wafers may be manifested depending on conditions of the epitaxial processes and thickness of the epitaxial layer after the epitaxial growth (Kimura et al., Journal of Japanese Association of Crystal Growth, Vol. 24, No. 5, p.444, 1997).

In particular, N-type substrates doped with antimony (referred to as "antimony-doped silicon single crystal wafers" hereinafter) used for low resistance devices have a higher grown-in defect density compared with usual P-type substrates doped with boron (referred to as "boron-doped silicon single crystal wafers" hereinafter), because the atomic radius of antimony is larger than that of silicon. Therefore, they have a problem that they suffer from much more significant influence of grown-in defects after the epitaxial growth compared with other substrates.

The importance of gettering techniques has become increasingly higher as one of the techniques for reducing such heavy metal impurities. In the production of the epitaxial silicon single crystal wafers for logic devices, p$^{++}$ type substrates consisting of boron-doped silicon single crystal wafers having a very high boron concentration expressed in terms of a resistivity of less than 10 mΩ·cm (referred to as "very highly boron-doped silicon single crystal wafer" hereinafter) have conventionally been used as substrate wafers for performing epitaxial growth, and they have afforded a higher device yield compared with substrate wafers consisting of p$^+$ type substrates of a high boron concentration that exhibit a resistivity of from 10 mΩ·cm to 100 mΩ·cm (referred to as "highly boron-doped silicon single crystal wafer" hereinafter). However, the very high boron concentration of the very highly boron-doped silicon single crystal wafer causes a problem that boron impurities in the substrates are once released into the gaseous phase and enter into the epitaxial growth layer again, which is called auto doping.

As countermeasures against such auto doping, for example, the epitaxial growth has been performed under reduced pressure atmosphere, or CVD oxide films have been provided on back surfaces of the substrates. However, there has been a problem that these treatments all lead to reduction of productivity, increase of cost and so forth.

Therefore, it was expected to use highly boron-doped silicon single crystal wafers, which did not require any countermeasure against the auto doping, as the substrate for performing epitaxial growth. However, gettering of the highly boron-doped silicon single crystal wafers having a low oxygen concentration is segregation type gettering attained by boron atoms. Therefore, they suffer from a problem of lower gettering ability for heavy metal impurities of copper, nickel and so forth compared with relaxation type gettering attained by oxide precipitates.

On the other hand, in the production of epitaxial silicon single crystal wafers for CCDs, N-type substrates such as N-type substrate doped with phosphorus (referred to as "phosphorus-doped silicon single crystal wafers" hereinafter), and antimony-doped silicon single crystal wafers have conventionally been used as the substrate for performing epitaxial growth. However, these N-type substrates also have a problem that oxygen precipitation is harder to occur in them compared with the boron-doped silicon single crystal wafers. Insufficiency of the gettering ability due to such an insufficient amount of oxygen precipitation in N-type substrates is a detrimental problem for devices sensitive to crystal defects resulting from heavy metal impurities, such as CCDs.

In particular, as for the antimony-doped silicon single crystal wafers, when a silicon single crystal ingot doped with antimony is grown by the Czochralski method, it is extremely difficult to maintain the oxygen concentration in a portion having a high antimony concentration obtained in the latter half of the growth of the single crystal ingot, because of evaporation of antimony oxide. For this reason, the oxygen concentration becomes low, and oxygen precipitation of silicon wafers cut out from such a portion is inhibited. Thus, gettering ability required for the device production cannot be obtained.

However, if it is attempted to obtain, in the antimony-doped silicon single crystal wafers or the phosphorus-doped silicon single crystal wafers, an amount of precipitated oxygen comparable to that obtained in the boron-doped silicon single crystal wafers, there would be caused a problem that prolonged oxygen precipitation heat treatment is required compared with the boron-doped silicon single crystal wafers, which leads to reduced productivity.

Specifically, as for the phosphorus-doped silicon single crystal wafers, for example, performed is a heat treatment called IG heat treatment comprising a first stage heat treatment at a high temperature of 1100° C. or higher, a heat treatment for formation of precipitation nuclei at about 600–700° C. as the second stage, and a heat treatment for formation of oxide precipitates at about 1000° C. as the third stage, for several hours for each stage.

On the other hand, if the oxygen concentration of wafers can be elevated in order to increase the oxygen precipitation of these highly boron-doped silicon single crystal wafers, antimony-doped silicon single crystal wafers and phosphorus-doped silicon single crystal wafers, oxygen precipitation would be promoted, and thus the period required for such heat treatments may be shortened. However, the amount of precipitated oxygen in wafers becomes excessive, and it will cause problems such as deformation of wafers and reduction of wafer strength. Moreover, when an epitaxial layer is formed on the surfaces of these silicon single crystal wafers, there would be caused a problem that harmful defects are generated in the epitaxial layer due to out-diffusion of oxygen impurities, and adversely affect the characteristics of semiconductor devices.

DISCLOSURE OF THE INVENTION

The present invention has been accomplished in order to solve these problems, and its major object is to produce and supply a silicon wafer for epitaxial growth consisting of a highly boron-doped silicon single crystal wafer, an antimony-doped silicon single crystal wafer or a phosphorus-doped silicon single crystal wafer, which allows easy oxygen precipitation and exhibits high gettering ability in spite of its suppressed substrate oxygen concentration that is suppressed in order not to cause problems such as deformation of wafers and reduction of wafer strength, and an epitaxial silicon single crystal wafer in which an epitaxial layer has an extremely low heavy metal impurity concentration and is grown by using the aforementioned wafer as a substrate wafer.

The present invention provides, in order to achieve the aforementioned object, a silicon single crystal wafer doped with a dopant, which has an oxide precipitate or oxidation induced stacking fault density of $1 \times 10^9$ number/cm$^3$ or higher after a precipitation heat treatment of the silicon single crystal wafer.

Such a silicon single crystal wafer doped with a dopant and having an oxide precipitate or oxidation induced stacking fault density of $1 \times 10^9$ number/cm$^3$ or higher after a precipitation heat treatment of the silicon single crystal wafer exhibits high gettering effect irrespective of the kind of the dopant. By using this wafer as a substrate wafer of an epitaxial silicon single crystal wafer, an epitaxial silicon single crystal wafer of high quality can be obtained.

The present invention also provides, in order to achieve the aforementioned object, a boron-doped silicon single crystal wafer having a resistivity of from 10 mΩ·cm to 100 mΩ·cm, wherein oxygen concentration in the boron-doped silicon single crystal wafer is 16 ppma according to the standard of JEIDA (Japan Electronic Industry Development Association) or less, and the wafer has an oxide precipitate or oxidation induced stacking fault density of $1 \times 10^9$ number/cm$^3$ or higher after a precipitation heat treatment.

Such a boron-doped silicon single crystal wafer having a resistivity of from 10 mΩ·cm to 100 mΩ·cm and an oxide precipitate or oxidation induced stacking fault density of $1 \times 10^9$ number/cm$^3$ or higher after a precipitation heat treatment in spite of the low oxygen concentration in the boron-doped silicon single crystal wafer of 16 ppma or less, in which oxygen is likely to precipitate, exhibits high gettering ability against heavy metal impurities such as those of copper and nickel. In addition, because of the low oxygen concentration in the wafer, deformation of the wafer or insufficient wafer strength can be prevented.

Furthermore, by using such a boron-doped silicon single crystal wafer as a substrate wafer for producing an epitaxial wafer, an epitaxial silicon single crystal wafer with high gettering effect and very low heavy metal impurity concentration in a semiconductor device production layer can be obtained with high productivity without generating harmful defects in the epitaxial layer caused by out-diffusion of oxygen impurities. At the same time, it can solve the problem of the auto doping.

The present invention also provide a boron-doped silicon single crystal wafer having a resistivity of from 10 mΩ·cm to 100 mΩ·cm, which is obtained by slicing a silicon single crystal ingot grown by the Czochralski method with nitrogen doping.

When a boron-doped silicon single crystal wafer having a resistivity of from 10 mΩ·cm to 100 mΩ·cm is one obtained by slicing a silicon single crystal ingot grown by the Czochralski method with nitrogen doping, oxygen precipitation is enhanced by the presence of nitrogen in a bulk portion of the wafer. Thus, the wafer can have high gettering effect even though it has such a low substrate oxygen concentration as will not cause problems such as deformation of the wafer or reduced wafer strength.

Furthermore, by using such a boron-doped silicon single crystal wafer as a substrate wafer for producing an epitaxial wafer, incorporation of impurities into the epitaxial layer due to the auto doping can be prevented, and an epitaxial silicon single crystal wafer that has high gettering effect and very low heavy metal impurity concentration can be obtained with high productivity.

Further, the aforementioned boron-doped silicon single crystal wafer preferably has an oxygen concentration of 16 ppma or less.

With such a low an oxygen concentration of 16 ppma or less, the risk of deformation of the wafer or reduction of wafer strength is further reduced. In addition, the formation of crystal defects in the boron-doped silicon single crystal wafer can be inhibited, and the formation of oxide precipitates in the wafer surface layer can be prevented. Therefore, when an epitaxial layer is formed on the wafer surface, the crystallinity of the epitaxial layer is not adversely affected. On the other hand, because oxygen precipitation is promoted in a bulk portion by the existence of nitrogen, sufficient gettering effect can be obtained in spite of such a low oxygen concentration.

The present invention further provides, in order to achieve the aforementioned object, an antimony-doped silicon single crystal wafer, which has a crystal defect density at a surface of the antimony-doped silicon single crystal wafer of 0.1 number/cm$^2$ or less.

Such an antimony-doped silicon single crystal wafer having a crystal defect density at a surface of the antimony-doped silicon single crystal wafer of 0.1 number/cm$^2$ or less is a silicon single crystal wafer in which the density of grown-in defects at the wafer surface is suppressed to an extremely lower level compared with conventional antimony-doped silicon single crystal wafers. Therefore, by using such an antimony-doped silicon single crystal wafer as a substrate wafer for producing an epitaxial wafer, an epitaxial silicon single crystal wafer having an epitaxial layer of good quality can be obtained.

The present invention also provides an antimony-doped silicon single crystal wafer, which has an oxide precipitate or oxidation induced stacking fault density of $1 \times 10^9$ number/cm$^3$ or higher after a precipitation heat treatment of the antimony-doped silicon single crystal wafer.

Such an antimony-doped silicon single crystal wafer having an oxide precipitate or oxidation induced stacking fault density of $1 \times 10^9$ number/cm$^3$ or higher after a precipitation heat treatment of the antimony-doped silicon single crystal wafer exhibits extremely high gettering ability. Therefore, it can be a silicon single crystal wafer of extremely low heavy metal impurity density in the wafer surface layer. Thus, by using such an antimony-doped silicon single crystal wafer as a substrate wafer for producing an epitaxial wafer, an epitaxial silicon single crystal wafer having an epitaxial layer of good quality can be obtained.

The present invention further provides an antimony-doped silicon single crystal wafer, which has a crystal defect density at a surface of the antimony-doped silicon single crystal wafer of 0.1 number/cm$^2$ or less, and an oxide precipitate or oxidation induced stacking fault density of $1 \times 10^9$ number/cm$^3$ or higher after a precipitation heat treatment.

Such an antimony-doped silicon single crystal wafer having a crystal defect density on a surface of the antimony-doped silicon single crystal wafer of 0.1 number/cm$^2$ or less and an oxide precipitate or oxidation induced stacking fault density of $1 \times 10^9$ number/cm$^3$ or higher after a precipitation heat treatment is a silicon single crystal wafer in which the density of grown-in defects on the wafer surface is suppressed to an extremely lower level compared with conventional antimony-doped silicon single crystal wafers. In addition, since it exhibits extremely high gettering ability, it can be a silicon single crystal wafer having an extremely low heavy metal impurity density in the wafer surface layer. Therefore, by using such an antimony-doped silicon single crystal wafer as a substrate wafer for producing an epitaxial wafer, an epitaxial silicon single crystal wafer having an epitaxial layer of extremely good quality can be obtained.

The present invention also provides an antimony-doped silicon single crystal wafer, which is obtained by slicing a silicon single crystal ingot grown by the Czochralski method with nitrogen doping.

Such an antimony-doped silicon single crystal wafer obtained by slicing a silicon single crystal ingot grown by the Czochralski method with nitrogen doping can have an extremely reduced density of large-size grown-in defects on the wafer surface due to the action of nitrogen. Moreover, oxygen precipitation is enhanced by the presence of nitrogen in a bulk portion of the wafer. Thus, the wafer can have high gettering effect after a heat treatment of short period of time even though it has such a relatively low substrate oxygen concentration as will not cause problems such as deformation of the wafer or reduction of wafer strength.

Furthermore, if such an antimony-doped silicon single crystal wafer is used as a substrate wafer for producing an epitaxial wafer, high gettering effect can be obtained by a heat treatment of short period of time, and heavy metal impurity concentration of the epitaxial layer can extremely be reduced, because the large-size grown-in defects on the wafer substrate surface are few, and hence adverse influence on the epitaxial layer becomes extremely small. Therefore, it can enable production of an epitaxial silicon single crystal wafer having an epitaxial layer of extremely high quality with high productivity.

Furthermore, the aforementioned antimony-doped silicon single crystal wafer preferably has an oxygen concentration of 20 ppma or less according to the standard of JEIDA (Japan Electronic Industry Development Association).

Such a low or medium oxygen concentration of 20 ppma or less reduces the risk of deformation of the wafer or reduction of wafer strength. In addition, it can inhibit formation of crystal defects in the antimony-doped silicon single crystal wafer, and prevent formation of oxide precipitates in the surface layer of the wafer. Therefore, when an epitaxial layer is formed on the wafer surface, the crystallinity of the epitaxial layer is not adversely affected. On the other hand, because oxygen precipitation is promoted by the existence of nitrogen in a bulk portion, sufficient gettering effect can be obtained in spite of such a low or medium oxygen concentration.

The present invention also provides, in order to achieve the aforementioned object, a phosphorus-doped silicon single crystal wafer, which has an oxygen concentration in the phosphorus-doped silicon single crystal wafer of 18 ppma or less according to the standard of JEIDA (Japan Electronic Industry Development Association), and an oxide precipitate or oxidation induced stacking fault density of $1 \times 10^9$ number/cm$^3$ or higher after a precipitation heat treatment.

Such a phosphorus-doped silicon single crystal wafer having an oxide precipitate or oxidation induced stacking fault density of $1 \times 10^9$ number/cm$^3$ or higher after a precipitation heat treatment in spite of the medium or low oxygen concentration in the phosphorus-doped silicon single crystal wafer of 18 ppma or less, in which oxygen precipitation is likely to occur, can have high gettering ability against heavy metal impurities such as those of copper and nickel even with a heat treatment of a short period of time. In addition, because of the low oxygen concentration in the wafer, deformation of the wafer or insufficient wafer strength can be prevented.

Furthermore, by using such a phosphorus-doped silicon single crystal wafer as a substrate wafer for producing an epitaxial wafer, an epitaxial silicon single crystal wafer with high gettering effect and a very low heavy metal impurity concentration can be obtained with high productivity by a heat treatment of a short period of time without generating harmful defects in the epitaxial layer caused by out-diffusion of oxygen impurities.

The present invention also provides a phosphorus-doped silicon single crystal wafer, which is obtained by slicing a silicon single crystal ingot grown by the Czochralski method with nitrogen doping.

In such a phosphorus-doped silicon single crystal wafer obtained by slicing a silicon single crystal ingot grown by the Czochralski method with nitrogen doping, oxygen precipitation is enhanced by the presence of nitrogen in a bulk portion of the wafer. Thus, the wafer can have high gettering effect with a heat treatment of a short period of time even though it has such a relatively low substrate oxygen concentration as will not cause problems such as deformation of the wafer or reduction of wafer strength.

Furthermore, if such a phosphorus-doped silicon single crystal wafer is used as a substrate wafer for producing an epitaxial wafer, an epitaxial silicon single crystal wafer of high gettering effect and an extremely low heavy metal impurity concentration can be obtained with high productivity by a heat treatment of a short period of time.

Furthermore, the aforementioned phosphorus-doped silicon single crystal wafer preferably has an oxygen concentration of 18 ppma or less.

Such a low or medium oxygen concentration of 18 ppma or less further reduces the risk of deformation of the wafer or reduction of wafer strength. In addition, it can inhibit formation of crystal defects in the phosphorus-doped silicon single crystal wafer, and prevent formation of oxide precipitates in the surface layer of the wafer. Therefore, when an epitaxial layer is formed on the wafer surface, the crystallinity of the epitaxial layer is not adversely affected. On the other hand, because oxygen precipitation is promoted by the existence of nitrogen in a bulk portion, sufficient gettering effect can be obtained in spite of such a low oxygen concentration.

When a silicon single crystal is grown with nitrogen doping, it is preferred that the doping should be performed so that the nitrogen concentration in the aforementioned silicon single crystal wafer should be $1\times10^{10}$ to $5\times10^{15}$ atoms/cm$^3$.

This is because the concentration is desirably $1\times10^{10}$ atoms/cm$^3$ or higher in order to suppress the formation of large-size grown-in defects in the silicon wafer and to obtain an effect for sufficiently promoting oxygen precipitation, and it is preferably $5\times10^{15}$ atoms/cm$^3$ or less in order not to inhibit single crystallization of the silicon single crystal by the Czochralski method.

Furthermore, the aforementioned silicon single crystal wafer is preferably one subjected to a heat treatment at a temperature of from 900° C. to the melting point of silicon.

In such a silicon single crystal wafer subjected to a heat treatment at a temperature of from 900° C. to the melting point of silicon, nitrogen and oxygen in the surface layer of the silicon single crystal wafer are out-diffused, and hence crystal defects at the wafer surface will become very few. Moreover, the subsequent precipitation is not inhibited by dissolution of precipitation nuclei during a heat treatment at a high temperature such as one for the formation of epitaxial layer, and a wafer exhibiting sufficient gettering effect is obtained.

The present invention further provides an epitaxial silicon single crystal wafer, wherein an epitaxial layer is formed on a surface of the silicon single crystal wafer of the present invention.

Such an epitaxial silicon single crystal wafer having an epitaxial layer formed on the surface of the silicon single crystal wafer of the present invention is free from the problem of auto doping, and hence it can have an epitaxial layer of high quality with a desired resistivity. In addition, it can be an epitaxial silicon single crystal wafer that can be produced with high productivity and have high gettering ability against heavy metal impurities such as those of copper and nickel and an extremely low heavy metal concentration in spite of such a suppressed substrate oxygen concentration as will not cause problems such as deformation of the wafer and reduction of wafer strength.

The present invention also provides a method for producing a boron-doped silicon single crystal wafer having a resistivity of from 10 mΩ·cm to 100 mΩ·cm , which comprises growing a silicon single crystal ingot doped with boron and nitrogen by the Czochralski method, and slicing the silicon single crystal ingot into a silicon single crystal wafer.

When a boron-doped silicon single crystal wafer having a resistivity of from 10 mΩ·cm to 100 mΩ·cm is produced by growing a silicon single crystal ingot doped with boron and nitrogen by the Czochralski method, and slicing the silicon single crystal ingot into a silicon single crystal wafer as described above, oxygen precipitation is enhanced by the presence of nitrogen in a bulk portion of the wafer. Therefore, there can be produced a boron-doped silicon single crystal wafer that has high gettering effect even though it has such a substrate oxygen concentration as will not cause problems such as deformation of the wafer or reduced wafer strength.

Furthermore, if a boron-doped silicon single crystal wafer produced by such a method is used as a substrate wafer for producing an epitaxial wafer, incorporation of impurities into an epitaxial layer due to the auto doping can be prevented, and hence an epitaxial silicon single crystal wafer of high gettering effect and an extremely low heavy metal impurity concentration can be obtained with high productivity.

In the aforementioned method, the oxygen concentration in the single crystal ingot is preferably controlled to be 16 ppma or less.

With such an oxygen concentration, sufficient gettering effect can be obtained without adversely affecting crystallinity of the epitaxial layer.

The present invention also provides a method for producing an antimony-doped silicon single crystal wafer, which comprises growing a silicon single crystal ingot doped with antimony and nitrogen by the Czochralski method, and slicing the silicon single crystal ingot into a silicon single crystal wafer.

By producing an antimony-doped silicon single crystal wafer by growing a silicon single crystal ingot doped with antimony and nitrogen by the Czochralski method, and slicing the silicon single crystal ingot into a silicon single crystal wafer as described above, the density of grown-in defects at the surface of the wafer is markedly reduced by the action of nitrogen. Moreover, oxygen precipitation is enhanced by the presence of nitrogen in a bulk portion of the wafer. Thus, there can be produced, with a heat treatment of short period of time, an antimony-doped silicon single crystal wafer that has high gettering effect even though it has such a relatively low substrate oxygen concentration as will not cause problems such as deformation of the wafer or reduced wafer strength.

Furthermore, if such an antimony-doped silicon single crystal wafer as produced by the aforementioned method is used as a substrate wafer for producing an epitaxial wafer, bad influence of the large-size grown-in defects at the substrate wafer surface on the epitaxial layer becomes extremely small, hence high gettering effect can be obtained by a heat treatment of a short period of time and heavy metal impurity concentration of the epitaxial layer can extremely be reduced. Therefore, it can enable production of an epitaxial silicon single crystal wafer having an epitaxial layer of extremely high quality with high productivity.

In the aforementioned method, the oxygen concentration in the single crystal ingot is preferably controlled to be 20 ppma or less.

With such an oxygen concentration, sufficient gettering effect can be obtained without adversely affecting crystallinity of the epitaxial layer.

The present invention also provides a method for producing a phosphorus-doped silicon single crystal wafer, which comprises growing a silicon single crystal ingot doped with phosphorus and nitrogen by the Czochralski method, and slicing the silicon single crystal ingot into a silicon single crystal wafer.

When a phosphorus-doped silicon single crystal wafer is produced by growing a silicon single crystal ingot doped with phosphorus and nitrogen by the Czochralski method, and slicing the silicon single crystal ingot into a silicon single crystal wafer as described above, oxygen precipitation is enhanced by the presence of nitrogen in a bulk portion of the wafer. Therefore, there can be produced, with a heat treatment of a short period of time, a phosphorus-doped silicon single crystal wafer, in which oxygen precipitation is relatively unlikely to occur, that can have high gettering effect even though it has such a substrate oxygen concentration as will not cause problems such as deformation of the wafer or reduction of wafer strength.

Furthermore, if a phosphorus-doped silicon single crystal wafer produced by such a method is used as a substrate wafer for producing an epitaxial wafer, an epitaxial silicon single crystal wafer having an epitaxial layer of high quality having high gettering effect and an extremely low heavy metal impurity concentration can be obtained by a heat treatment of a short period of time with high productivity.

In the aforementioned method, the oxygen concentration in the single crystal ingot is preferably controlled to be 18 ppma or less.

With such an oxygen concentration, sufficient gettering effect can be obtained without adversely affecting crystallinity of the epitaxial layer.

Further, when a silicon single crystal doped with nitrogen is grown by the Czochralski method in the aforementioned method, it is preferred that the nitrogen doping should be performed so that the nitrogen concentration in the aforementioned single crystal ingot should be $1\times10^{10}$ to $5\times10^{15}$ atoms/cm$^3$, and the silicon single crystal wafer is preferably subjected to a heat treatment at a temperature of from 900° C. to the melting point of silicon.

By producing a silicon single crystal wafer as described above, there can be produced a silicon single crystal wafer having further higher gettering ability, few surface defects and other various excellent characteristics, which is suitable for a substrate wafer on which epitaxial growth is performed.

The present invention also provides a method for producing an epitaxial silicon single crystal wafer, which comprises producing a silicon single crystal wafer by the method for producing a silicon single crystal wafer of the present invention, and forming an epitaxial layer on a surface of the silicon single crystal wafer.

If an epitaxial silicon single crystal wafer is produced by producing a silicon single crystal wafer by the method for producing a silicon single crystal wafer of the present invention, and forming an epitaxial layer on a surface of the silicon single crystal wafer as described above, influence of grown-in defects at the substrate wafer surface on the epitaxial layer becomes extremely small, and the heavy metal impurity concentration in the epitaxial layer can be extremely reduced because high gettering effect against heavy metals can be imparted by a heat treatment of a short period of time even though the substrate oxygen concentration is suppressed in order not to cause problems such as deformation of the wafer and reduction of wafer strength. Therefore, an epitaxial silicon single crystal wafer having an epitaxial layer of high quality can be produced with high productivity.

As described above, a silicon wafer doped with nitrogen is used as a substrate for an epitaxial silicon single crystal wafer in the present invention. This enables easy production of silicon single crystal wafers of high quality, in which oxygen precipitation readily occur and high gettering effect is exerted, even for a highly boron-doped silicon single crystal wafer of a low oxygen concentration as well as antimony-doped silicon single crystal wafer and phosphorus-doped silicon single crystal wafer in which oxygen precipitation is hard to occur. Furthermore, when epitaxial growth is performed on a surface of the wafer, an epitaxial silicon single crystal wafer of high quality with a low defect density and a low heavy metal impurity concentration in the epitaxial layer can easily be produced with high productivity.

BEST MODE FOR CARRYING OUT THE INVENTION

Hereafter, the present invention will be further explained in detail. However, the present invention is not limited by these explanations.

The inventors of the present invention found that an epitaxial single crystal wafer having high gettering effect and an extremely low heavy metal impurity concentration can be produced with high productivity and low cost without generating harmful defects in the epitaxial layer caused by out-diffusion of oxygen impurities, by obtaining a silicon single crystal wafer consisting of a highly boron-doped silicon single crystal wafer having a resistivity of from 10 mΩ·cm to 100 mΩ·cm, antimony-doped silicon single crystal wafer or phosphorus-doped silicon single crystal wafer having a low oxygen concentration and a high oxide precipitate or oxidation induced stacking fault density, which is produced by the CZ method, in particular, with a technique of nitrogen doping during the crystal growth, and using it as a substrate wafer for the production of an epitaxial silicon single crystal wafer.

That is, it has been pointed out that, if nitrogen is doped in a silicon single crystal, the aggregation of oxygen atoms in silicon is promoted and oxide precipitate concentration becomes high (T. Abe and H. Takeno, Mat. Res. Soc. Symp. Proc. Vol. 262, 3, 1992). It is thought that this effect is caused by the shift of the aggregation process of oxygen atoms from homogenous nucleus formation to heterogenous nucleus formation utilizing nitrogen impurities as the nuclei.

Therefore, by doping a silicon single crystal with nitrogen when it is grown by the Czochralski method, a silicon single crystal with high oxide precipitate concentration can be obtained, and a silicon single crystal wafer with high oxide precipitate concentration can be obtained by processing the single crystal. And by growing an epitaxial layer using this silicon single crystal wafer as a substrate, a high oxide precipitate density can be obtained even in a boron-doped silicon single crystal wafer of a low oxygen concentration, as well as an antimony-doped silicon single crystal wafer and a phosphorus-doped silicon single crystal wafer, in which oxygen precipitation is originally hard to occur. As a result, an epitaxial layer with a very low heavy metal impurity density can be grown. Moreover, since the oxygen concentration in a wafer can be made low, problems such as deformation of the wafer and reduction of wafer strength are not caused, and the epitaxial layer is not adversely affected by oxygen impurities.

Further, a silicon single crystal wafer which is produced with nitrogen doping during the growth of the silicon single crystal can have high gettering effect even if it is a wafer having a doping amount of boron of from 10 mΩ·cm to 100 mΩ·cm expressed in terms of resistivity or a wafer doped with antimony or phosphorus in which the oxygen precipitation is originally hard to occur. Therefore, an epitaxial layer of excellent quality can be formed, and countermeasures against the auto doping also become unnecessary. Thus, not only improvement of the quality of epitaxial silicon single crystal wafer, but also improvements of productivity and cost can be expected.

For the purpose of the present invention, a silicon single crystal ingot doped with boron and nitrogen can be grown by the Czochralski method according to a known method such as disclosed in, for example, Japanese Patent Application Laid-open (KOKAI) No. 60-251190.

That is, the Czochralski method comprises contacting a seed crystal with a melt of polycrystal silicon raw material contained in a quartz crucible, and slowly pulling it with rotation to grow a silicon single crystal ingot having an intended diameter. In such a method, boron and nitrogen can be doped in the pulled silicon single crystal by charging a polycrystal silicon raw material doped with boron together with nitride in a quartz crucible beforehand, adding nitride into the silicon melt, or using an atmosphere gas containing nitrogen. A doping amount of nitrogen in the crystal can be adjusted by controlling the amount of nitride, concentration or time of introduction of nitrogen gas.

By doping a single crystal with nitrogen when it is grown by the Czochralski method, large-size grown-in defects to be introduced can be reduced, and the oxygen atom aggregation in silicon can simultaneously be enhanced to obtain a high oxide precipitate concentration. This method does not require the conventionally used decrease of pulling speed for reducing the grown-in defects, and it can readily be performed by using a conventional production apparatus. Therefore, it does not require any newly added production apparatus, and it enables the production of silicon single crystals with high productivity.

Moreover, according to conventional techniques, the oxygen precipitation in a highly boron-doped silicon single crystal wafer having a resistivity of from 10 mΩ·cm to 100 mΩ·cm is more suppressed compared with a very highly boron-doped silicon single crystal wafer having a resistivity of less than 10 mΩ·cm . Further, the oxygen precipitation is harder to occur in an antimony-doped silicon single crystal wafer and a phosphorus-doped silicon single crystal wafer compared with a boron-doped silicon single crystal wafer. Thus, gettering ability required for the device production cannot be obtained.

In the case of an antimony-doped silicon single crystal wafer, in particular, when a silicon single crystal ingot doped with antimony is grown by the Czochralski method, it is very difficult to maintain the oxygen concentration high in the latter half of the grown single crystal ingot having a high antimony concentration due to evaporation of antimony oxide. Therefore, the oxygen concentration becomes very low, thus the oxygen precipitation of the silicon wafer sliced from such a portion is suppressed, and gettering ability required for the device production cannot be obtained.

On the other hand, if oxygen concentration in these wafers is elevated to solve the aforementioned problems, deformation of the wafers or reduction of wafer strength is caused. Further, when an epitaxial layer is formed on the wafer surfaces, defects caused by out-diffusion of oxygen impurities are generated, and hence the characteristics are degraded on the contrary. However, by doping nitrogen in a silicon single crystal as in the present invention, gettering ability required for the device production can be obtained without elevating the oxygen concentration.

As for the reason for the acceleration of aggregation of oxygen atoms and elevation of oxide precipitate concentration in a silicon single crystal when it is doped with nitrogen, it is considered to be due to the shift of aggregation process of oxygen atoms from homogenous nucleus formation to heterogenous nucleus formation utilizing nitrogen impurities as the nuclei as described above.

Therefore, the concentration of the doped nitrogen is preferably $1 \times 10^{10}$ atoms/cm$^3$ or higher, in which range the heterogenous nucleus formation is sufficiently caused. A concentration of the doped nitrogen in this range can sufficiently elevate the oxide precipitate concentration. On the other hand, if the nitrogen concentration exceeds $5 \times 10^{15}$ atoms/cm$^3$, which is the solid solubility limit in a silicon single crystal, the single crystallization of the silicon single crystal itself may be inhibited. Therefore, it is preferred that it does not exceed that concentration.

Further, a high oxide precipitate concentration can be obtained even with a low oxygen concentration according to the present invention. Therefore, when a silicon single crystal ingot doped with nitrogen is grown by the Czochralski method, oxygen concentration in the ingot can be controlled to be a medium or low concentration, i.e., 16 ppma or less when it is doped with boron, 20 ppma or less when it is doped with antimony, or 18 ppma or less when it is doped with phosphorus.

When the oxygen concentration in a silicon single crystal is the aforementioned values or lower, formation of defects such as oxide precipitates at a silicon single crystal wafer surface, which degrade crystallinity of an epitaxial layer, can substantially completely be prevented. Therefore, bad influence on the crystallinity of the epitaxial layer, which is grown on the silicon single crystal wafer surface, can be prevented. On the other hand, in a bulk portion, gettering effect can sufficiently be obtained even with a low oxygen concentration, because oxygen precipitation is promoted by the existence of nitrogen.

The oxygen concentration in a silicon single crystal ingot may be reduced to the aforementioned ranges by a conventional method. An oxygen concentration within the aforementioned ranges can easily be obtained by, for example, reducing crucible rotation number, increasing introduced gas flow rate, lowering atmospheric pressure, controlling temperature distribution and convection of a silicon melt or the like.

In this way, a silicon single crystal ingot doped with boron, antimony or phosphorus and nitrogen at desired concentrations and containing few large-size crystal defects and oxygen at a desired concentration can be obtained by the Czochralski method. This ingot is sliced by using a cutting machine such as an inner diameter slicer or wire saw, and subjected to steps of chamfering, lapping, etching, polishing and so forth to be processed into silicon single crystal wafers. Of course, these steps are mere examples, and there may be used various other steps such as cleaning step and heat treatment step. Further, the steps are used with suitable modification including the alteration of the order of steps, omission of some steps and so forth.

Further, before performing the epitaxial growth, the obtained silicon single crystal wafer is preferably subjected to a heat treatment at a temperature of 900° C. to the melting point of silicon. By performing such a heat treatment before forming an epitaxial layer, nitrogen in a surface layer of the silicon single crystal wafer can be out-diffused.

The nitrogen in a silicon single crystal wafer surface layer is out-diffused in order that the epitaxial layer should not subsequently be adversely affected by formation of defects due to oxygen precipitation in the silicon single crystal wafer surface layer caused by the oxygen precipitation promoting effect of nitrogen.

Diffusion rate of nitrogen in silicon is markedly faster than that of oxygen. Therefore, nitrogen in the surface layer can surely be out-diffused by the heat treatment. As for the specific condition of the heat treatment, it is preferably performed in a temperature range of 900° C. to the melting point of silicon, more preferably 1100° C. to 1200° C.

By subjecting the silicon single crystal wafer to a heat treatment within such a temperature range, nitrogen in the surface layer of the silicon single crystal wafer can sufficiently be out-diffused, and oxygen can simultaneously be out-diffused. Therefore, generation of defects due to oxide precipitates at the surface can be substantially completely prevented, and bad influence on the crystallinity of the epitaxial layer can be prevented.

Further, there may be an anxiety that, if the aforementioned heat treatment is not performed before the epitaxial growth and thus the wafer is directly subjected to a heat treatment at a high temperature for the epitaxial growth, oxygen precipitation nuclei may be melted and sufficient precipitation is not caused even in a subsequent heat treatment, and thus gettering effect cannot be obtained. However, by performing such a heat treatment as mentioned above before performing the heat treatment at a high temperature for epitaxial growth, sufficient gettering effect can be obtained during the formation of the epitaxial layer, and thus an epitaxial silicon single crystal wafer with an extremely low heavy metal impurity concentration can be obtained.

Furthermore, as a secondary effect, the oxide precipitates in a bulk portion of wafer may further grow to induce bulk stacking faults (BSF), thereby exerting stronger gettering effect.

The present invention will be further explained with reference to the following examples and comparative examples hereinafter. However, the present invention is not limited to these.

EXAMPLE 1

Raw material polycrystal silicon added with boron at a concentration determined so that a resistivity of from 10 mΩ·cm to 100 mΩ·cm should be obtained was charged into a quartz crucible having a diameter of 24 inches together with silicon wafers having a silicon nitride film, and melted. A single crystal ingot of P-type having a diameter of 8 inches and direction <100> was pulled from the melt at a usual pulling rate of 1.0 mm/min according to the CZ method. When the crystal was pulled, the rotation of the crucible was controlled so that oxygen concentration in the single crystal should become 14–16 ppma (JEIDA).

The nitrogen concentration was $2-7 \times 10^{14}$ atoms/cm$^3$ in terms of a value calculated by using a segregation coefficient. When the oxygen concentration of the single crystal ingot was measured by the gas fusion method, it was confirmed to be 14–16 ppma.

Wafers were cut out from the single crystal ingot obtained above by using a wire saw, and subjected to chamfering, lapping, etching and mirror polishing to produce four silicon single crystal mirror surface wafers having a diameter of 8 inches. When resistivity of these four silicon single crystal wafers was measured, all four wafers had a resistivity of about 14–17 mΩ·cm, which was within the range expected from the added doping amount of boron.

Two of these four silicon single crystal wafers were subjected to a heat treatment at a temperature of 1050° C. before forming epitaxial layers on their surfaces to out-diffuse nitrogen in the wafer surface layers.

Then, an epitaxial layer having a thickness of 6 μm was grown at 1170° C. on one wafer each from each of these two silicon single crystal wafers subjected to the heat treatment and the other two not subjected to the heat treatment, and at 1130° C. on the other wafers from each of the two sets of two wafers. The epitaxial growth furnace was a furnace of a single wafer processing type, and the heating was performed by lamp heating. By introducing SiHCl$_3$+H$_2$ into the furnace, epitaxial growth of silicon was attained on the boron-doped silicon single crystal wafers.

In order to measure gettering ability of the epitaxial wafers obtained as described above, the wafers were subjected to a heat treatment at 800° C. in N$_2$ gas atmosphere for 4 hours, and then a heat treatment at 1000° C. in O$_2$ gas atmosphere for 16 hours to precipitate oxide precipitates. Then, gettering effect of these epitaxial silicon single crystal wafers was evaluated based on oxide precipitate concentration in bulk portions of the wafers.

The oxide precipitate concentration was measured by the OPP (Optical Precipitate Profiler) method. In this OPP method, which utilizes a Nomarski differential interference microscope, a laser light emitted from a light source is separated into two linearly polarized light beams by a polarizing prism, which are orthogonally intersects with each other and have phases different by 90°, and the beams are entered into a wafer from the wafer mirror surface side. At that time, when one beam passes a defect, phase shift is caused and hence phase difference between the two beams is produced. This phase difference is detected by a polarization analyzer after the beams transmit the wafer back face to detect the defect.

Figure 1:
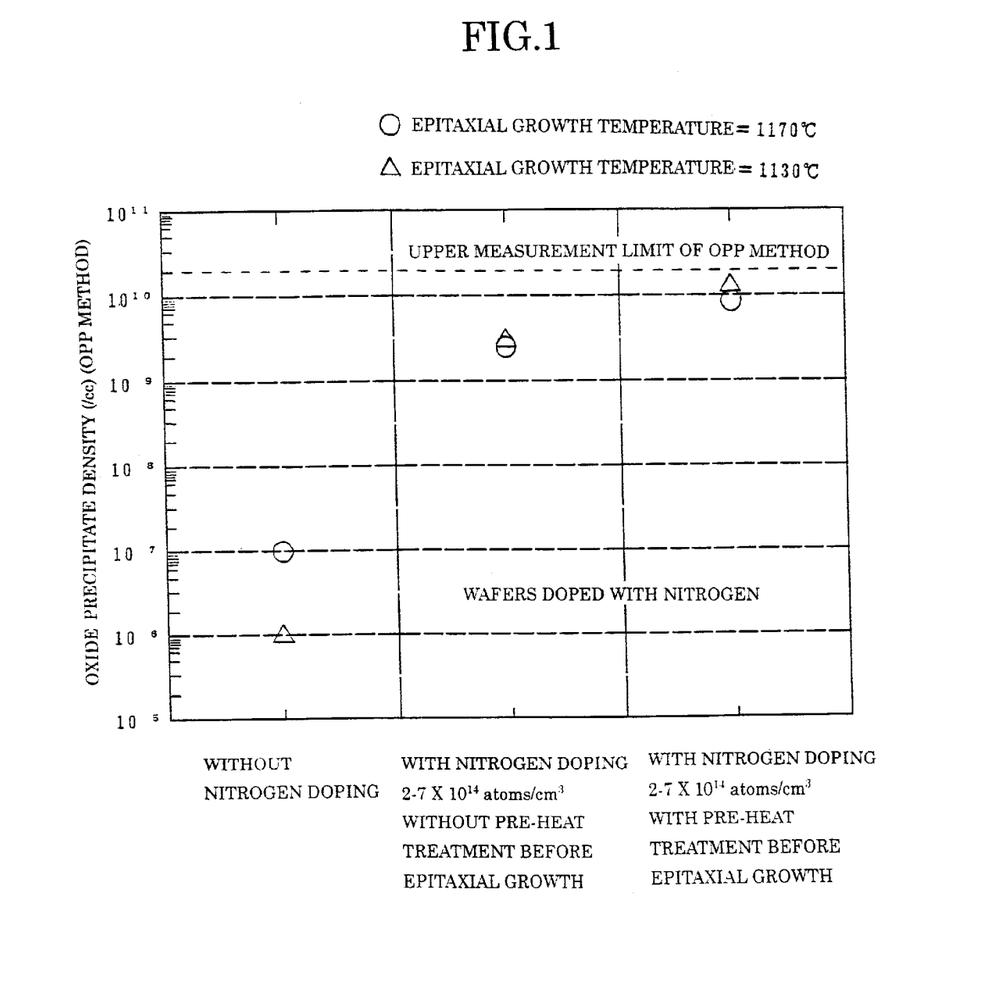
FIG. 1 is a graph representing the results of oxide precipitate defect density measurement performed by the OPP method for wafers after a heat treatment for precipitation of oxide precipitates in Example 1 and Comparative Example 1.

The results of this measurement are shown in FIG. 1. The plots shown in the right side of FIG. 1 represent the oxide precipitate defect densities of the wafers having a nitrogen doping amount of $2-7 \times 10^{14}$ atoms/cm$^3$. The plots indicated with circles represent the results obtained when the epitaxial growth was performed at 1170° C., and the plots indicated with triangles represent the results obtained when the epitaxial growth was performed at 1130° C.

From the results shown in FIG. 1, it can be seen that the wafers in which the epitaxial growth was performed on the surfaces of the boron-doped silicon single crystal wafers doped with nitrogen showed high oxide precipitate densities for the both epitaxial growth temperatures in spite of the low oxygen concentrations of 14–16 ppma, and thus they had high gettering effect. When the wafers subjected to the heat treatment and not subjected to it are compared, it can be seen that higher gettering effect was obtained in the heat-treated wafers. Further, since the oxygen concentration was low, the crystallinity of the epitaxial layers was very good. Furthermore, because no countermeasure against the auto doping is required at such a level of boron doping concentration, improvement of productivity can be expected.

COMPARATIVE EXAMPLE 1

A boron-doped single crystal ingot of P-type having a diameter of 8 inches, direction <100> and an oxygen concentration of 14–16 ppma was pulled in the same manner as in the example except that nitrogen was not doped. Then, two silicon single crystal mirror surface wafers having a diameter of 8 inches were produced from the above single crystal ingot in the same manner as in the example. Both of these silicon single crystal wafers had a resistivity of about 14–17 mΩ·cm as in the example.

Then, an epitaxial layer having a thickness of 6 μm was grown at 1170° C. on one silicon single crystal wafer and at 1130° C. on the other wafer among the two wafers in the same manner as in the example except that the heat treatment for out-diffusing nitrogen was not performed.

In the obtained epitaxial wafers, oxide precipitates were precipitated by a heat treatment in the same manner as in the example, and gettering effect of these epitaxial silicon single crystal wafers was evaluated by the OPP method based on oxide precipitate concentration in bulk portions of the wafers.

The results of this measurement are also shown in FIG. 1. The plots shown in the left side of FIG. 1 represent the oxide precipitate defect densities of the wafers not doped with nitrogen. The plot indicated with a circle represents the oxide precipitate defect density obtained when the epitaxial growth was performed at 1170° C., and the plot indicated with a triangle represents the oxide precipitate defect density obtained when the epitaxial growth was performed at 1130° C.

From the results shown in FIG. 1, it can be seen that the wafers in which the epitaxial growth was performed on the surfaces of the boron-doped silicon single crystal wafers not doped with nitrogen showed low oxide precipitate densities as for the both epitaxial growth temperatures because of the low oxygen concentrations of 14–16 ppma, and thus they had low gettering effect.

EXAMPLE 2

Raw material polycrystal silicon added with antimony at a predetermined concentration was charged into a quartz crucible having a diameter of 24 inches together with silicon wafers having a silicon nitride film, and melted. A single crystal ingot of N-type having a diameter of 8 inches and direction <100> was pulled from the melt at a usual pulling rate of 1.0 mm/min according to the CZ method. When the crystal was pulled, the rotation of the crucible was controlled so that oxygen concentration in the single crystal should become 20 ppma or less (JEIDA). By repeating the above procedure, two single crystal ingots with different nitrogen doping amounts were pulled.

The nitrogen concentration in tail portions of these single crystal ingots was estimated as values calculated by using a segregation coefficient, and they showed nitrogen concentration of $1.0 \times 10^{14}$ atoms/cm$^3$ and $5.0 \times 10^{14}$ atoms/cm$^3$, respectively. When the oxygen concentration of the single crystal ingots was measured by the gas fusion method, it was confirmed to be 10–20 ppma for both of the two ingots.

Wafers were cut out from the two single crystal ingots obtained above by using a wire saw, and subjected to chamfering, lapping, etching and mirror polishing to produce two silicon single crystal mirror surface wafers having a diameter of 8 inches from each ingot, i.e., four wafers in total. When resistivity of these four silicon single crystal wafers was measured, all four wafers had a resistivity of about 7–25 mΩ·cm, which was within the range expected from the added doping amount of antimony.

These silicon single crystal wafers were subjected to a heat treatment at a temperature of 1100° C. before forming epitaxial layers on their surfaces to out-diffuse nitrogen in the wafer surface layers.

Further, in order to measure crystal defect density at the wafer surface before epitaxial growth, the four silicon single crystal wafers were sufficiently cleaned, and crystal defect density at the wafer surfaces was measured by a particle counter.

Then, as for the four silicon single crystal wafers cut out from the two silicon crystal ingots, an epitaxial layer having a thickness of 6 μm was grown at 1200° C. on one wafer each from each of these two silicon single crystal wafers cut out from the same ingot, and at 1125° C. on the other wafers. The epitaxial growth furnace was a furnace of single wafer processing type, and the heating was performed by lamp heating. By introducing $SiHCl_3+H_2$ into the furnace, epitaxial growth of silicon was attained on the antimony-doped silicon single crystal wafers.

In order to measure gettering ability of the epitaxial wafers obtained as described above, the wafers was subjected to a heat treatment at 800° C. in $N_2$ gas atmosphere for 4 hours, and then a heat treatment at 1000° C. in $O_2$ gas atmosphere for 16 hours to allow precipitation of oxide precipitates. Then, gettering effect of these epitaxial silicon single crystal wafers was evaluated based on oxide precipitate concentration in the silicon wafers. The oxide precipitate concentration was measured by the aforementioned OPP method.

On the other hand, in order to measure the effect of crystal defects at the substrate wafer surface on the epitaxial layers, crystal defect density at the surfaces of these epitaxial silicon single crystal wafers after the epitaxial growth was measured as density of particles having a size of 0.13 μm or more by a particle counter.

Figure 2:
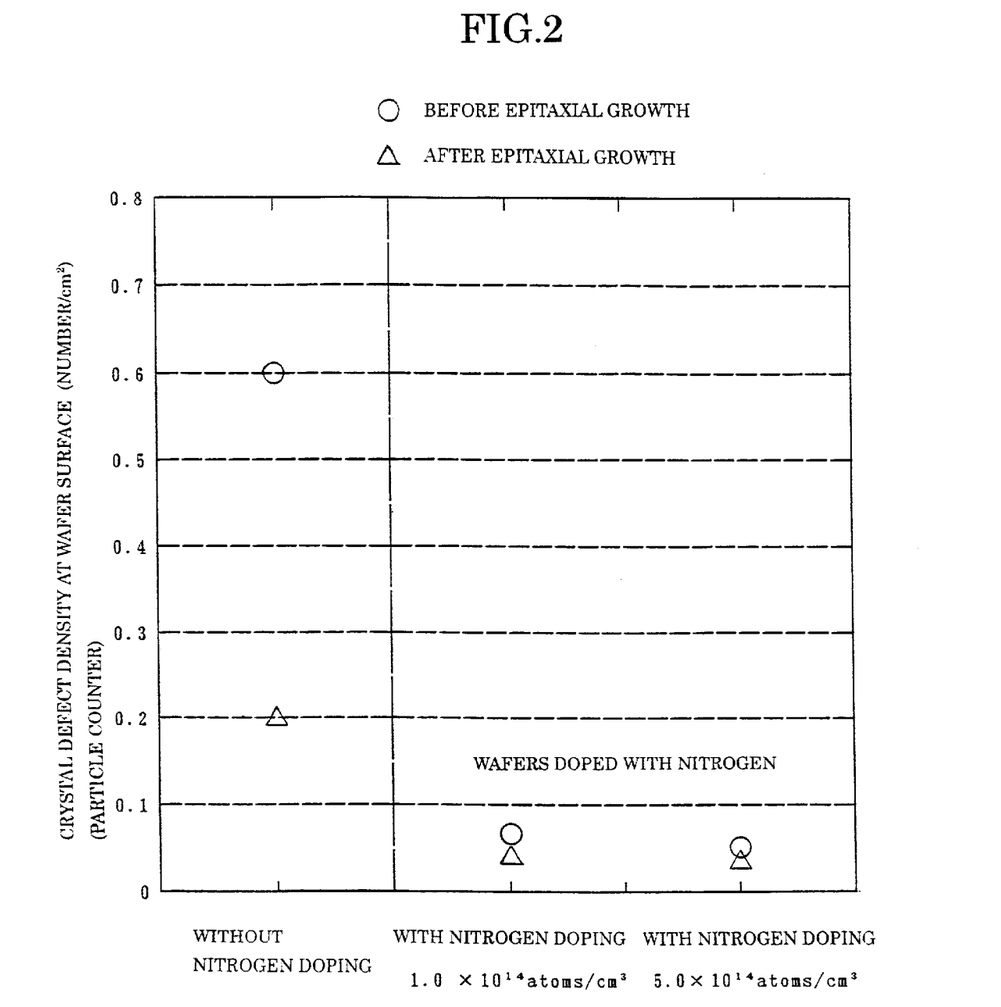
FIG. 2 is a graph representing the results of measurement of crystal defect density at wafer surfaces performed with a particle counter for wafers before and after epitaxial growth in Example 2 and Comparative Example 2.

First, the results of the measurement of the crystal defect density before and after the epitaxial growth are shown in, FIG. 2. The plots shown in the center of FIG. 2 represent the crystal defect densities at the surfaces of the wafers having a nitrogen doping amount of $1.0 \times 10^{14}$ atoms/cm$^3$, and the plots shown in the right side of FIG. 2 represent the crystal defect densities at the surfaces of the wafers having a nitrogen doping amount of $5.0 \times 10^{14}$ atoms/cm$^3$. The plots indicated with circles represent crystal defect densities before the epitaxial growth, and the plots indicated with triangles represent crystal defect densities after the epitaxial growth. These values indicate averages of values obtained from two wafers of the same nitrogen doping amount.

From the results shown in FIG. 2, it can be seen that the wafers of the both nitrogen doping amount of $1.0 \times 10^{14}$ atoms/cm$^3$ and $5.0 \times 10^{14}$ atoms/cm$^3$ had an extremely low crystal defect density of 0.1 number/cm$^2$ or less before and after the epitaxial growth.

Figure 3:
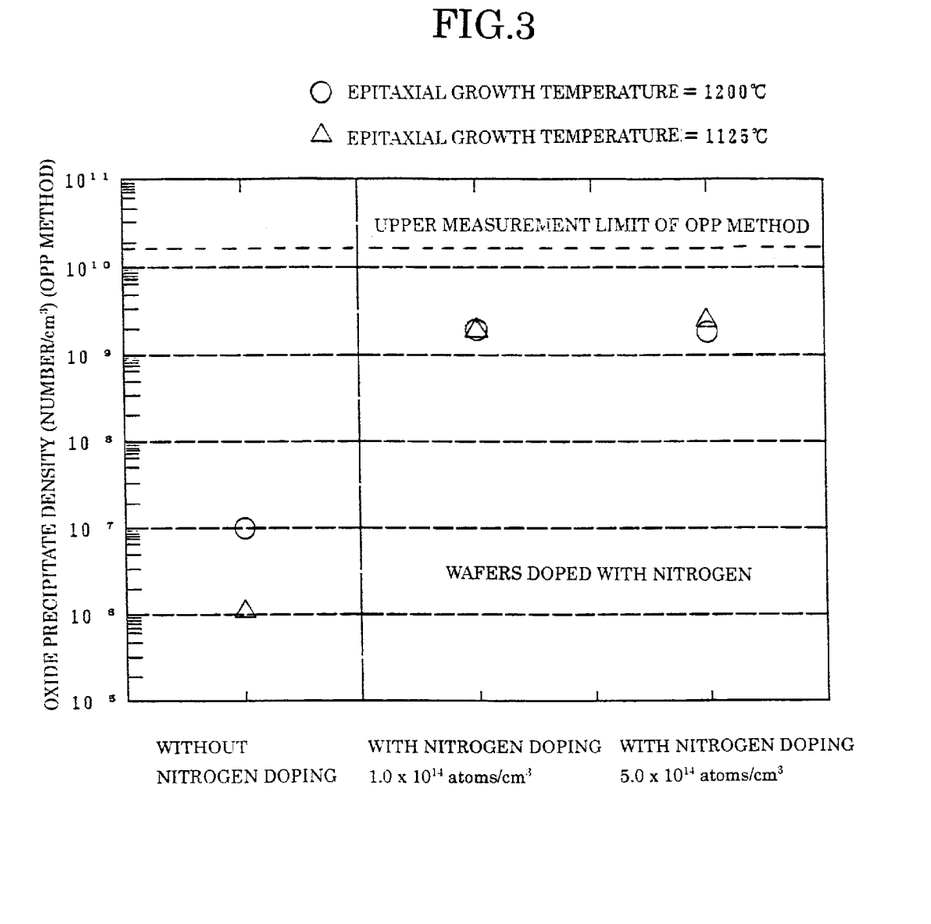
FIG. 3 is a graph representing the results of oxide precipitate defect density measurement performed by the OPP method for wafers after a heat treatment for precipitation of oxide precipitates in Example 2 and Comparative Example 2.

Then, the results of the measurement of the oxide precipitate density after the heat treatment for oxygen precipitation are shown in FIG. 3. The plots shown in the center of FIG. 3 represent the oxide precipitate densities of the wafers having a nitrogen doping amount of $1.0 \times 10^{14}$ atoms/cm$^3$ and the plots shown in the right side of FIG. 3 represent the oxide precipitate densities of the wafers having a nitrogen doping amount of $5.0 \times 10^{14}$ atoms/cm$^3$. The plots indicated with circles represent the oxide precipitate defect densities obtained when the epitaxial growth was performed at 1200° C., and the plots indicated with triangles represent the oxide precipitate defect densities obtained when the epitaxial growth was performed at 1125° C.

From the results shown in FIG. 3, it can be seen that the wafers in which the epitaxial growth was performed on the surfaces of the antimony-doped silicon single crystal wafers doped with nitrogen showed high oxide precipitate densities as for the both epitaxial growth temperatures in spite of the medium oxygen concentrations of 10–20 ppma, and thus they had high gettering effect. Further, the heat treatment time for gettering effect required for the production of the epitaxial silicon single crystal wafers in this example was comparable to that required when the boron-doped silicon single crystal wafers were used as the substrate wafers. Therefore, improvement of productivity can be expected.

COMPARATIVE EXAMPLE 2

An antimony-doped single crystal ingot of N-type having a diameter of 8 inches, direction <100> and an oxygen concentration of 20 ppma or less was pulled in the same manner as in the example except that nitrogen was not doped. Then, two silicon single crystal mirror surface wafers having a diameter of 8 inches were produced from the above single crystal ingot in the same manner as in the example. Both of these two silicon single crystal wafers had a resistivity of about 7–25 mΩ·cm as in the example.

Then, without performing the heat treatment for out-diffusing nitrogen, crystal defect density at the wafer surfaces was measured by a particle counter, and an epitaxial layer having a thickness of 6 μm was grown at 1200° C. on one silicon single crystal wafer and at 1125° C. on the other wafer among the two wafers in the same manner as in the example.

In the obtained epitaxial wafers, precipitation of oxide precipitates was caused in the same manner as in the example. Then, gettering effect of these epitaxial silicon single crystal wafers was evaluated by the OPP method based on oxide precipitate concentration in bulk portions of the silicon wafers, and crystal defect density at the wafer surfaces after the epitaxial growth was measured by a particle counter.

The results of the measurement of the crystal defect density before and after the epitaxial growth in this comparative example are also shown in FIG. 2. The plots shown in the left side of FIG. 2 represent the crystal defect densities of the wafers not doped with nitrogen. The plot indicated with a circle represents crystal defect density before the epitaxial growth, and the plot indicated with a triangle represents the crystal defect density after the epitaxial growth. These values indicate averages of values obtained from two wafers.

From the results shown in FIG. 2, it can be seen that the antimony-doped silicon single crystal wafers not doped with nitrogen had a crystal defect density at the wafer surfaces exceeding 0.5 number/cm$^2$ before and after the epitaxial growth, which is a markedly higher crystal defect density compared with that of the wafers doped with nitrogen.

The results of the measurement for the oxide precipitate density of the wafers in this comparative example after the heat treatment for oxygen precipitation are also shown in FIG. 3. The plots shown in the left side of FIG. 3 represent the oxide precipitate densities of the wafers not doped with nitrogen. The plot indicated with a circle represent the crystal precipitate density obtained when the epitaxial growth was performed at 1200° C., and the plot indicated with a triangle represent the crystal precipitate density obtained when the epitaxial growth was performed at 1125° C.

From the results shown in FIG. 3, it can be seen that the wafers in which the epitaxial growth was performed on the surfaces of the antimony-doped silicon single crystal wafers not doped with nitrogen showed low oxide precipitate densities and thus they had low gettering effect as for both of the epitaxial growth temperatures because the heat treatment time used was comparable to that used for the case where the boron-doped silicon single crystal wafers were used as the substrate wafers and the wafers had the medium oxygen concentrations of 20 ppma or less.

EXAMPLE 3

Raw material polycrystal silicon added with phosphorus at a predetermined concentration was charged into a quartz crucible having a diameter of 18 inches together with silicon wafers having a silicon nitride film, and melted. A single crystal ingot of N-type having a diameter of 6 inches and direction <100> was pulled from the melt at a usual pulling rate of 1.0 mm/min according to the CZ method. When the crystal was pulled, the rotation of the crucible was controlled so that oxygen concentration in the single crystal should become 18 ppma (JEIDA).

The nitrogen concentration of the tail portion of the single crystal ingot was measured by FT-IR, and it was found to be $5.0 \times 10^{14}$ atoms/cm$^3$. When the oxygen concentration of the single crystal ingot was measured by FT-IR, it was confirmed to be 18 ppma.

Wafers were cut out from the single crystal ingot obtained above by using a wire saw, and subjected to chamfering, lapping, etching and mirror polishing to produce four silicon single crystal mirror surface wafers having a diameter of 6 inches. When resistivity of these four silicon single crystal wafers was measured, all four wafers had a resistivity of about 5–10Ω·cm, which was within the range expected from the added doping amount of phosphorus.

Two of these four silicon single crystal wafers were subjected to a heat treatment at a temperature of 1100° C. for 30 minutes to out-diffuse nitrogen in the wafer surface layers before forming epitaxial layers on their surfaces.

Then, an epitaxial layer having a thickness of 20 μm was grown at 1170° C. on one wafer each from each of these two silicon single crystal wafers subjected to the heat treatment and the other two not subjected to the heat treatment, and at 1130° C. on the other wafers from each of the two sets of two wafers. The epitaxial growth furnace comprised a bell jar of cylinder type containing within it a susceptor on which a substrate wafer was placed, and the heating was attained by radiation heating. By introducing SiHCl$_3$+H$_2$ into the furnace, epitaxial growth of silicon was attained on the phosphorus-doped silicon single crystal wafers.

In order to measure gettering ability of the epitaxial wafers obtained as described above, the wafers was subjected to a heat treatment at 800° C. in N$_2$ gas atmosphere for 4 hours, and then a heat treatment at 1000° C. in O$_2$ gas atmosphere for 16 hours to cause precipitation of oxide precipitates.

Then, gettering effect of these epitaxial silicon single crystal wafers was evaluated based on oxide precipitate concentration in bulk portions of the wafers. The oxide precipitate concentration was measured by the aforementioned OPP method.

Figure 4:
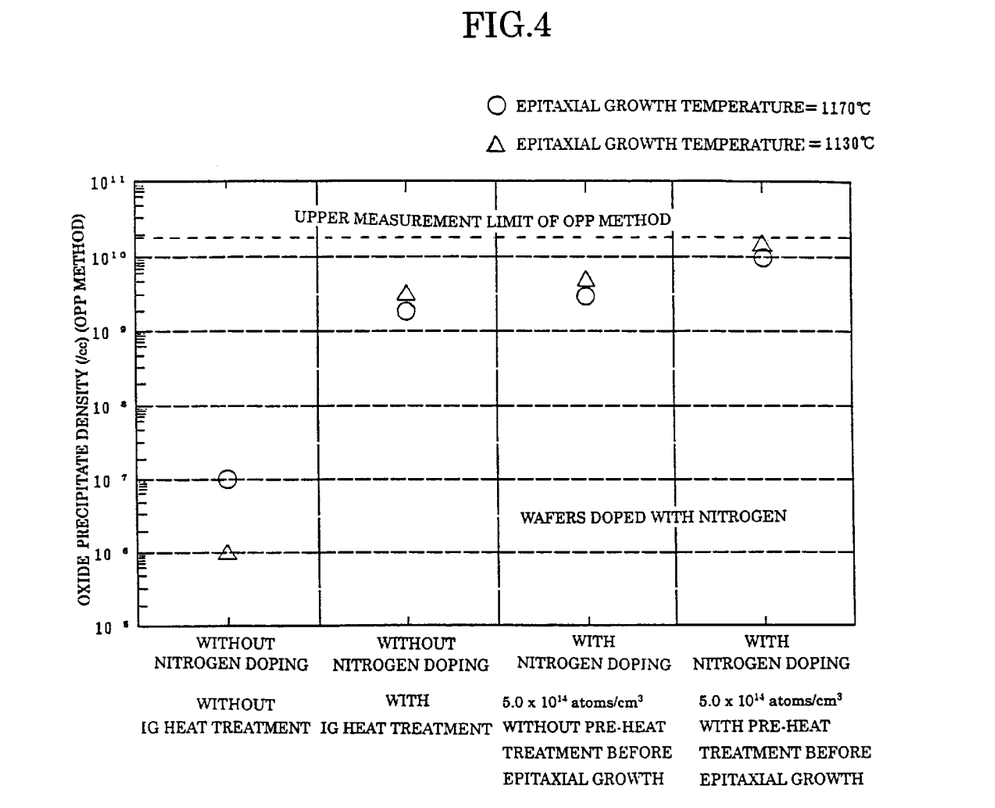
FIG. 4 is a graph representing the results of oxide precipitate defect density measurement performed by the OPP method for wafers obtained in Example 3 and Comparative Example 3.

The results of this measurement are shown in FIG. 4. The plots shown in the right side of FIG. 4 represent the oxide precipitate defect densities of the wafers having a nitrogen doping amount of $5.0 \times 10^{14}$ atoms/cm$^3$. The plots indicated with circles represent the oxide precipitate defect densities obtained when the epitaxial growth was performed at 1170° C., and the plots indicated with triangles represent the oxide precipitate defect densities obtained when the epitaxial growth was performed at 1130° C.

From the results shown in FIG. 4, it can be seen that the wafers in which the epitaxial growth was performed on the surfaces of the phosphorus-doped silicon single crystal wafers doped with nitrogen showed high oxide precipitate densities of $1 \times 10^9$ number/cm$^3$ or higher as for the both epitaxial growth temperatures in spite of the medium oxygen concentrations of 18 ppma, and thus they had high gettering effect. When the wafers subjected to the heat treatment and not subjected to it are compared, it can be seen that further higher gettering effect was obtained in the heat-treated wafers. Further, since the oxygen concentration was low, the crystallinity of the epitaxial layers was very good. Furthermore, the time required for the heat treatment for precipitation before the epitaxial growth in this example was much shorter than that required with no heat treatment or with the conventional IG heat treatment. Therefore, improvement of productivity can be expected.

COMPARATIVE EXAMPLE 3

A phosphorus-doped single crystal ingot of N-type having a diameter of 6 inches, direction <100> and an oxygen concentration of 18 ppma was pulled in the same manner as in the example except that nitrogen was not doped. Then, four silicon single crystal mirror surface wafers having a diameter of 6 inches were produced from the above single crystal ingot in the same manner as in the example. All of these four silicon single crystal wafers had a resistivity of about 5–10Ω·cm as in the example.

Two of these four wafers were subjected to IG heat treatment for further promoting oxygen precipitation. That is, they are first subjected to a first-stage heat treatment at 1100° C. for 30 minutes, then a heat treatment for formation of precipitation nuclei at 650° C. for 4 hours, and a heat treatment for formation of oxide precipitates at 1000° C. for 16 hours. An epitaxial layer having a thickness of 20 μm was grown at 1170° C. on one wafer each from each of these two silicon single crystal wafers subjected to the heat treatment and the other two not subjected to the heat treatment, and at 1130° C. on the other wafers from each of the two sets of two wafers. Then, oxygen precipitation of oxide precipitates was caused in the obtained epitaxial wafers by a heat treatment in the same manner as in the example, and gettering effect of these epitaxial silicon single crystal wafers was evaluated by the OPP method based on oxide precipitate concentration in bulk portions of the silicon wafers.

The results of this measurement are also shown in FIG. 4. The plots shown in the left side of FIG. 4 represent the oxide precipitate defect densities of the wafers not doped with nitrogen. The plots indicated with circles represent the oxide precipitate defect densities obtained when the epitaxial growth was performed at 1170° C., and the plots indicated with triangles represent the oxide precipitate defect densities obtained when the epitaxial growth was performed at 1130° C.

From the results shown in FIG. 4, it can be seen that, without the IG heat treatment before the epitaxial growth, the wafers in which the epitaxial growth was performed on the phosphorus-doped silicon single crystal wafers not doped with nitrogen showed low oxide precipitate densities and hence low gettering effect for the both epitaxial growth temperatures because of the medium oxygen concentration of 18 ppma. Further, even with the IG heat treatment taking a long period of time, the wafers showed only precipitate densities comparable to those obtained with nitrogen doping and no heat treatment before the epitaxial growth.

The present invention is not limited to the embodiments described above. The above-described embodiments are mere examples, and those having the substantially same structure as that described in the appended claims and providing the similar functions and advantages are included in the scope of the present invention.

For example, when a silicon single crystal ingot doped with nitrogen is grown by the Czochralski method according to the present invention, the melt may be or may not be applied with a magnetic field. That is, the Czochralski method used for the present invention includes the so-called MCZ method wherein a magnetic field is applied to the melt.

Further, the epitaxial growth is not limited to epitaxial growth by the CVD method, and the present invention can be used for the case where an epitaxial silicon single crystal substrate is produced by performing the epitaxial growth by the MBE method.

Furthermore, although the aforementioned embodiments were mainly explained for the cases where wafers of high gettering effect were obtained by, in particular, using nitrogen doping even for highly boron-doped silicon single crystal wafers of a high boron doping concentration and low oxygen concentration, and antimony-doped or phosphorus-doped silicon single crystal wafers of medium or low oxygen concentration, the present invention is not limited to these. Those highly boron-doped silicon single crystal wafers having a resistivity of from 10 mΩ·cm to 100 mΩ·cm, a low oxygen concentration in the silicon single crystal wafers of 16 ppma or less and a large oxide precipitate or oxidation induced stacking fault density of $1 \times 10^9$ number/cm$^3$ or higher after a precipitation heat treatment, those antimony-doped silicon single crystal wafers having a small crystal defect density at the surfaces of the silicon single crystal wafers of 0.1 number/cm$^2$ or less and a large oxide precipitate or oxidation induced stacking fault density of $1 \times 10^9$ number/cm$^3$ or higher after a precipitation heat treatment, and those phosphorus-doped silicon single crystal wafers having a medium or low oxygen concentration in the silicon single crystal wafers of 18 ppma or less and a large oxide precipitate or oxidation induced stacking fault density of $1 \times 10^9$ number/cm$^3$ or higher after a precipitation heat treatment are encompassed within the scope of the present invention.

The definition of the "oxide precipitate or oxidation induced stacking fault density of $1 \times 10^9$ number/cm$^3$ or higher" include such an oxide precipitate or oxidation induced stacking fault density obtained even after a silicon wafer is subjected to a precipitation heat treatment or after a silicon wafer is subjected to a heat treatment for the epitaxial growth and a subsequent precipitation heat treatment.

What is claimed is:

1. An epitaxial silicon single crystal wafer, wherein an epitaxial layer is formed on a surface of a boron-doped silicon single crystal wafer having a resistivity of from 10 mΩ·cm to 100 mΩ·cm, which is obtained by slicing a silicon single crystal ingot grown by the Czochralski method with nitrogen doping, having a nitrogen concentration of $1 \times 10^{10}$ to $5 \times 10^{15}$ atoms/cm$^3$ and having an oxygen concentration of 16 ppma or less.

2. The epitaxial silicon single crystal wafer according to claim 1, wherein the boron-doped silicon single crystal wafer is subjected to a heat treatment at a temperature of from 900° C. to the melting point of silicon.

3. The epitaxial silicon single crystal wafer according to claim 1, wherein the boron-doped silicon single crystal wafer has an oxide precipitate or oxidation induced stacking fault density of $1 \times 10^9$ number/cm$^3$ or higher after a precipitation heat treatment.

4. The epitaxial silicon single crystal wafer according to claim 1, wherein the boron-doped silicon single crystal wafer is obtained by slicing a silicon single crystal ingot grown by the Czochralski method at a pulling rate of 1.0 mm/min or more.

5. An epitaxial silicon single crystal wafer, wherein an epitaxial layer is formed on a surface of an antimony-doped silicon single crystal wafer, which is obtained by slicing a silicon single crystal ingot grown by the Czochralski method with nitrogen doping, having a nitrogen concentration of $1 \times 10^{10}$ to $5 \times 10^{15}$ atoms/cm$^3$ and having an oxygen concentration of 20 ppma or less.

6. The epitaxial silicon single crystal wafer according to claim 5, wherein the antimony-doped silicon single crystal wafer is subjected to a heat treatment at a temperature of from 900° C. to the melting point of silicon.

7. The epitaxial silicon single crystal wafer according to claim 5, wherein the antimony-doped silicon single crystal wafer has a crystal defect density of 0.1 number/cm$^2$ or less on a surface thereof.

8. The epitaxial silicon single crystal wafer according to claim 5, wherein the antimony-doped silicon single crystal wafer is obtained by slicing a silicon single crystal ingot grown by the Czochralski method at a pulling rate of 1.0 mm/min or more.

9. An epitaxial silicon single crystal wafer, wherein an epitaxial layer is formed on a surface of a phosphorus-doped silicon single crystal wafer, which is obtained by slicing a silicon single crystal ingot grown by the Czochralski method with nitrogen doping, having a nitrogen concentration of $1 \times 10^{10}$ to $5 \times 10^{15}$ atoms/cm$^3$ and having an oxygen concentration of 18 ppma or less.

10. The epitaxial silicon single crystal wafer according to claim 9, wherein the phosphorus-doped silicon single crystal wafer is subjected to a heat treatment at a temperature of from 900° C. to the melting point of silicon.

11. The epitaxial silicon single crystal wafer according to claim 9, wherein the phosphorus-doped silicon single crystal wafer has an oxide precipitate or oxidation induced stacking fault density of $1 \times 10^9$ number/cm$^3$ or higher after a precipitation heat treatment.

12. The epitaxial silicon single crystal wafer according to claim 9, wherein the phosphorus-doped silicon single crystal wafer is obtained by slicing a silicon single crystal ingot grown by the Czochralski method at a pulling rate of 1.0 mm/min or more.

13. A method for producing an epitaxial silicon single crystal wafer, which comprises growing a silicon single crystal ingot doped with boron and nitrogen by the Czochralski method having a resistivity of 10 mΩ·cm to 100 mΩ·cm, having a nitrogen concentration of $1 \times 10^{10}$ to $5 \times 10^{15}$ atoms/cm$^3$ and having an oxygen concentration of 16 ppma or less, slicing the silicon single crystal ingot into a silicon single crystal wafer having a resistivity of from 10 mΩ·cm to 100 mΩ·cm, and forming an epitaxial layer on a surface of the silicon single crystal wafer.

14. The method according to claim 13, wherein after the silicon single crystal wafer is subjected to a heat treatment at a temperature of from 900° C. to the melting point of silicon, an epitaxial layer is formed thereon.

15. The method according to claim 13, wherein the silicon single crystal wafer is obtained by slicing a silicon single crystal ingot grown by the Czochralski method at a pulling rate of 1.0 mm/min or more.

16. A method for producing an epitaxial silicon single crystal wafer, which comprises growing a silicon single crystal ingot doped with antimony and nitrogen by the Czochralski method having a nitrogen concentration of $1 \times 10^{10}$ to $5 \times 10^{15}$ atoms/cm$^3$ and having an oxygen concentration of 20 ppma or less, slicing the silicon single crystal ingot into a silicon single crystal wafer, and forming an epitaxial layer on a surface of the silicon single crystal wafer.

17. The method according to claim 16, wherein the silicon single crystal wafer is subjected to a heat treatment at a temperature of from 900° C. to the melting point of silicon.

18. The method according to claim 16, wherein the silicon single crystal wafer is obtained by slicing a silicon single crystal ingot grown by the Czochralski method at a pulling rate of 1.0 mm/min or more.

19. A method for producing an epitaxial silicon single crystal wafer, which comprises growing a silicon single crystal ingot doped with phosphorus and nitrogen by the Czochralski method having a nitrogen concentration of $1 \times 10^{10}$ to $5 \times 10^{15}$ atoms/cm$^3$ and having an oxygen concentration of 18 ppma or less, slicing the silicon single crystal ingot into a silicon single crystal wafer, and forming an epitaxial layer on a surface of the silicon single crystal wafer.

20. The method according to claim 19, wherein the silicon single crystal wafer is subjected to a heat treatment at a temperature of from 900° C. to the melting point of silicon.

21. The method according to claim 19, wherein the silicon single crystal wafer is obtained by slicing a silicon single crystal ingot grown by the Czochralski method at a pulling rate of 1.0 mm/min or more.

* * * * *